United States Patent
Hu et al.

(10) Patent No.: US 10,298,366 B2
(45) Date of Patent: May 21, 2019

(54) CIRCUIT AND METHOD FOR PREDISTORTION

(71) Applicant: Montage Technology (Shanghai) Co., Ltd., Shanghai (CN)

(72) Inventors: Gang Hu, Shanghai (CN); Xuepeng Wang, Shanghai (CN); Yuanfei Nie, Shanghai (CN)

(73) Assignee: MONTAGE TECHNOLOGY (SHANGHAI) CO., LTD., Shanghai (CN)

( * ) Notice: Subject to any disclaimer, the term of this patent is extended or adjusted under 35 U.S.C. 154(b) by 18 days.

(21) Appl. No.: 15/278,047

(22) Filed: Sep. 28, 2016

(65) Prior Publication Data
US 2019/0097589 A1 Mar. 28, 2019

(30) Foreign Application Priority Data
Aug. 26, 2016 (CN) .......................... 2016 1 0736548

(51) Int. Cl.
*H04L 5/00* (2006.01)
(52) U.S. Cl.
CPC .................. *H04L 5/0007* (2013.01)
(58) Field of Classification Search
CPC ... H04L 5/0007; H04L 27/362; H04L 27/366; H04L 27/367
See application file for complete search history.

(56) References Cited

U.S. PATENT DOCUMENTS
2012/0119831 A1 5/2012 Bai

FOREIGN PATENT DOCUMENTS
| CN | 102522957 A | 6/2012 |
|----|----|----|
| CN | 103179074 A | 6/2013 |

*Primary Examiner* — Adam D Houston
(74) *Attorney, Agent, or Firm* — Oliff PLC

(57) ABSTRACT

A circuit for predistortion, comprising a digital predistorter configured to generate a modified digital signal by modifying an input baseband signal with a predistortion coefficient; a DAC configured to generate an analog signal by converting the modified digital signal; a PA configured to generate an amplified signal by amplifying the analog signal; an attenuator configured to generate an attenuated signal by attenuating the amplified signal; an ADC configured to generate a attenuated digital signal; a timing synchronizer configured to generate a synchronized amplified signal by synchronizing the attenuated digital signal with the modified digital signal; a statistics generator configured to generate a probability density function of a plurality of samples of the input baseband signal; an orthogonal basis function generator configured to generate a set of normalized orthogonal basis functions; a predistortion coefficient training circuit configured to generate an updated predistortion coefficient.

10 Claims, 7 Drawing Sheets

CIRCUIT AND METHOD FOR PREDISTORTION

CROSS REFERENCE TO RELATED APPLICATION

This application claims priority to Chinese application No. 201610736548. 1 entitled "circuit and method for predistortion," filed on Aug. 26, 2016 by Montage Technology (Shanghai) Co., Ltd., which is incorporated herein by reference.

TECHNICAL FIELD

The present invention relates to digital circuit, and more particularly, but not limited to circuit and method for predistortion.

BACKGROUND

In a wireless communication system, the RF power amplifier (PA) is one of the major power-consuming devices. Therefore, improving the efficiency of power amplifier can effectively reduce system power consumption.

The power efficiency of power amplifier is negatively correlated to its linearity. When a system is operating in its non-linear region of the power amplifier, it will cause distortion to in-band signal and out-band spectral spreading, therefore further deteriorating the performance of the overall system. Further, modulation techniques (such as Orthogonal Frequency Division Multiplexing (OFDM)) adopted by communication systems with high spectral efficiency are even more sensitive to non-linearity of the power amplifier.

Effective ways to improve linearity of the power amplifier include a feed-forward (Feed-Forward) technology, negative feedback technology and predistortion technology. Digital based predistortion (or digital predistortion) technology has the advantage of high stability, low cost, and suitable for wideband signals.

Digital predistortion technology may be implemented using a polynomial method. The digital predistortion technology based on common digital polynomial has the disadvantage of slow convergence and low numerical stability, because of the high correlation among columns of the matrix used for deriving pre-distortion model parameters. Therefore, it is desirable to design a circuit and a method to increase convergence speed to derive the predistortion model parameters.

SUMMARY

According to an embodiment of the invention, a circuit for predistortion comprises a digital predistorter, configured to generate a modified digital signal by modifying an input baseband signal with a predistortion coefficient; a digital to analog converter (DAC) connected to the digital predistorter and configured to generate an analog signal by converting the modified digital signal; a power amplifier (PA) connected to the digital to analog converter and configured to generate an amplified signal by amplifying the analog signal; an attenuator connected to the power amplifier and configured to generate an attenuated signal by attenuating the amplified signal; an analog to digital converter (ADC) connected to the attenuator, configured to generate an attenuated digital signal; a timing synchronizer connected to both the digital predistorter and the analog to digital converter and configured to generate a synchronized signal by synchronizing the attenuated digital signal with the modified digital signal; a statistics generator connected to the analog to digital converter and configured to generate a probability density function of a plurality of samples of the input baseband signal; an orthogonal basis function generator connected to the statistics generator and configured to generate a set of normalized orthogonal basis functions; a predistortion coefficient training circuit connected to the orthogonal basis function generator and the timing synchronizer and configured to generate an updated predistortion coefficient; wherein the predistortion coefficient training circuit is further connected to the digital predistorter, and the digital predistorter is configured to generate a modified digital signal by modifying an input baseband signal with the updated predistortion coefficient.

According to another embodiment of the invention, a method for predistortion, comprises generating, by a digital predistorter, a modified digital signal by modifying an input baseband signal with a predistortion coefficient; generating, by a digital to analog converter connected to the digital predistorter, an analog signal by converting the modified digital signal; generating, by a power amplifier connected to the digital to analog converter, an amplified signal by amplifying the analog signal; generating, by an attenuator connected to the power amplifier, an attenuated signal by attenuating the amplified signal; generating, by an analog to digital converter connected to the attenuator, an attenuated digital signal; generating, by a timing synchronizer connected to both the digital predistorter and the analog to digital converter, a synchronized signal by synchronizing the attenuated digital signal with the modified digital signal; generating, by a statistics generator connected to the analog to digital converter, a probability density function of a plurality of samples of the input baseband signal; generating, by an orthogonal basis function generator connected to the statistics generator, a set of normalized orthogonal basis functions; generating, by a predistortion coefficient training circuit connected to the orthogonal basis function generator and the synchronizer, an updated predistortion coefficient; generating, by the digital predistorter further connected to the predistortion coefficient training circuit, a modified digital signal by modifying an input baseband signal with the updated predistortion coefficient.

DESCRIPTION OF THE DRAWINGS

The present invention is illustrated in an exemplary manner by the accompanying drawings. The drawings should be understood as exemplary rather than limiting, as the scope of the invention is defined by the claims. In the drawings, the identical reference signs represent the same elements.

DETAILED DESCRIPTION

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

Figure 1:
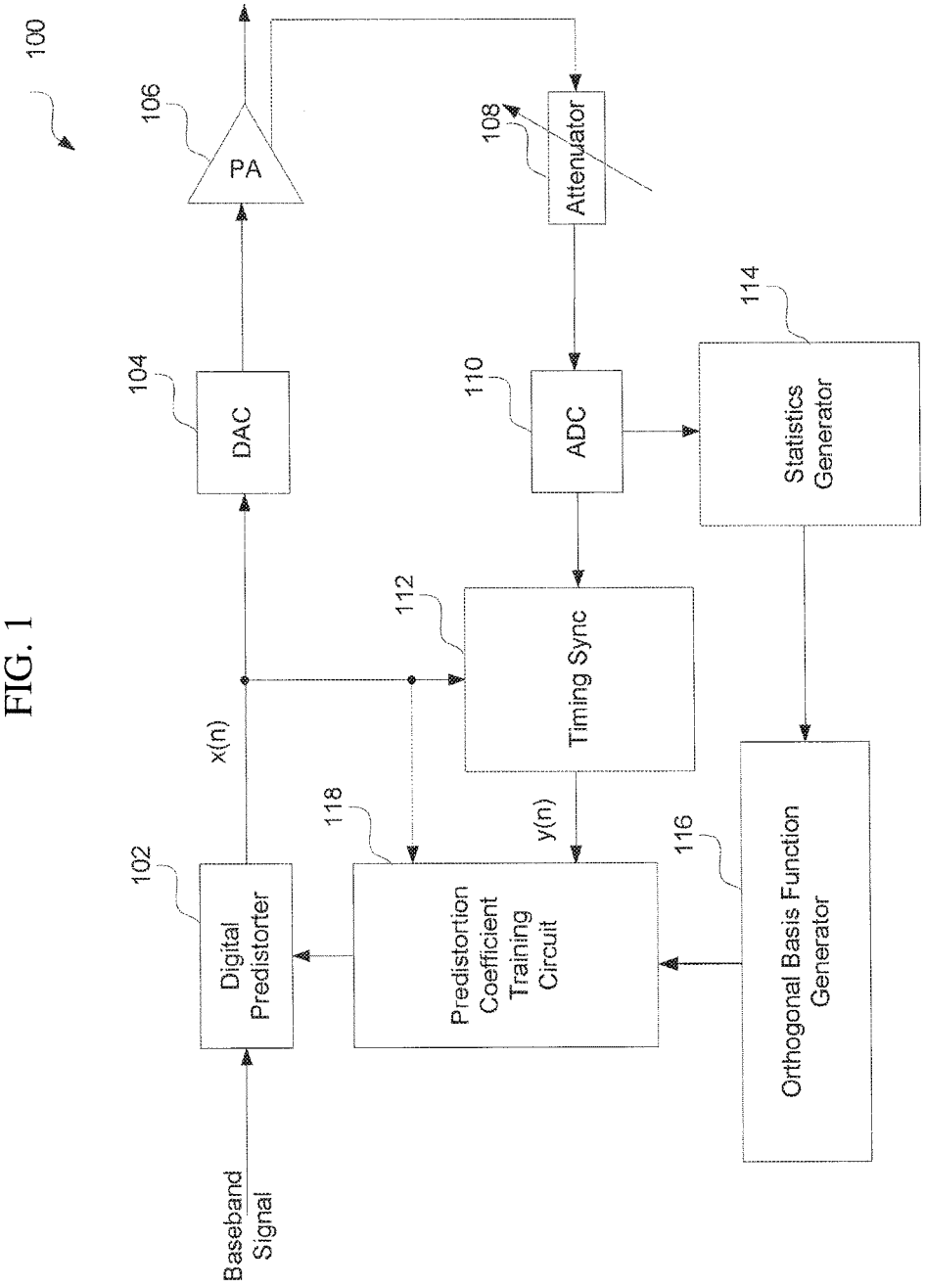
FIG. 1 is a circuit diagram for predistortion circuit according to an embodiment of the invention.

FIG. 1 is a circuit diagram for predistortion circuit 100 according to an embodiment of the invention.

As shown in FIG. 1, the predistortion circuit 100 comprises a digital predistorter 102, a digital to analog converter (DAC) 104, a power amplifier (PA) 106, an attenuator 108, an analog to digital converter (ADC) 110, a timing synchronizer (Sync) 112, a statistics generator 114, an orthogonal basis function generator 116, and a predistortion coefficient training circuit 118. The digital to analog converter 104 is connected to the digital predistorter 102. The power amplifier 106 is connected to the digital to analog converter 104. The attenuator 108 is connected to the power amplifier 106. The analog to digital converter 110 is connected to the attenuator 108. The timing synchronizer 112 is connected to both the digital predistorter 102 and the analog to digital converter 110. The statistics generator 114 is connected to the analog to digital converter 110 and the orthogonal basis function generator 116.

The digital predistorter 102 generates a modified digital signal by modifying an input baseband signal with a predistortion coefficient. The input baseband signal is a digital signal. The Digital predistortion technology is introduced before the non-linear power amplifier 106. The operating characteristics of the digital predistorter 102 is complementary to the operating characteristics of the power amplifier 106, such that the combination of the digital predistorter 102 and the power amplifier 106 will exhibit a linear transmission characteristic, thereby eliminating the non-linear effect of the power amplifier 106. Note the digital predistorter 102 does not work upon initial power on. In other words, the digital predistorter 102 will not pre-distort the baseband signal. The digital predistorter 102 will work after the predistortion coefficient training circuit 118 has trained and outputted training predistortion coefficient.

The digital to analog converter 104 generates an analog signal by converting the modified digital signal. The power amplifier 106 generates an amplified signal by amplifying the analog signal.

The attenuator 108 generates an attenuated signal by attenuating the amplified signal.

The analog to digital converter 110 generates an attenuated digital signal by converting the attenuated signal.

The timing synchronizer 112 generates a synchronized amplified signal (i.e., the attenuated and synchronized output signal of the power amplifier y(n) in the following description) by synchronizing the attenuated digital signal with the modified digital signal. The synchronized amplified signal is a received signal from the power amplifier 106 that is synchronized with the transmit signal (i.e., the input signal of the power amplifier x(n) in the following description) transmitted by the digital predistorter 102.

The statistics generator 114 generates a probability density function (PDF) of a plurality of samples of the attenuated digital signal. Note during operation, the statistics generator 114 samples and performs statistics analysis on the input baseband signals. In other words, the digital predistorter 102 will not pre-distort the signal. When the statistics generator 114 works, the digital predistorter 102 does not work. In other words, the data collected by the statistics generator 114 are not predistorted by the digital predistorter 102.

The orthogonal basis function generator 116 is connected to the statistics generator 114. The orthogonal basis function generator 116 generates a set of normalized orthogonal basis functions. Note any two orthogonal basis functions within the set of the normalized orthogonal basis functions are orthogonal.

The predistortion coefficient training circuit 118 is connected to the orthogonal basis function generator 116, the timing synchronizer 112, and the input port and output port of the digital predistorter 102. The predistortion coefficient training circuit 118 generates an updated predistortion coefficient by estimating predistortion coefficient according to signal output by the digital predistorter 102, the synchronized amplified signal generated by the timing synchronizer 112, and the normalized orthogonal basis functions generated by the orthogonal basis function generator 116. The updated predistortion coefficient is outputted to the digital predistorter 102 after all the training samples have been trained (for example, the statistics generator 114 generates 500 thousand samples in total. All 500 thousand samples have been trained in the predistortion coefficient training circuit 118).

The predistortion coefficient training circuit 118 is further connected to the digital predistorter 102. After the predistortion coefficient training circuit 118 outputs the updated predistortion coefficient, the digital predistorter 102 generates a modified digital signal by modifying an input baseband signal with the updated predistortion coefficient.

Alternatively, the predistortion coefficient training circuit 118 further generates the updated predistortion coefficient based on the equation $$z(n) = \sum_{k=1}^{K} \sum_{q=0}^{Q} w_{kq} \phi_k(x(n-q)),$$

wherein K represents a non-linear order, Q represents a memory depth, $w_{kq}$ represents the updated predistortion coefficient, $\phi_k(x)$ represents a plurality of non-linear transformation of the input baseband signal, wherein any two of different $\phi_k(x)$ are orthogonal. X(n) represents the current input sample, x(n−1) presents an input sample of a previous time instance, . . . x(n−q) represents input sample of q previous sampling time instances, and so on. Due to the orthogonal characteristics, self correlation function matrix corresponding to $\phi_k(x)$ has good condition numbers, therefore the phenomena of value instability will not occur when solving the coefficient for the orthogonal polynomials. In the field of numerical analysis, the condition number of a function with respect to an argument measures how much the output value of the function can change for a small change in the input argument. This is used to measure how sensitive a function is to changes or errors in the input, and how much error in the output results from an error in the input. Note the self correlation function matrix correspond to $\phi_k(x)$. The good condition numbers of self correlation function matrix means that variation ranges of eigenvalues of the matrix are relatively small. In solving matrix problems, good condition numbers means that minor variation in choosing values for the matrix elements will not result in great variation in the values of the coefficient which are solved.

Referring back to FIG. 1, firstly, when the digital predistorter 102 does not work, it outputs baseband signal x(n) which is not predistorted. The baseband signal is converted by the DAC 104 and inputted into the power amplifier 106, and then the power amplifier 106 outputs amplified signal. The receiver end (such as the attenuator 108) analyzes a frequency distribution for the amplitude of the power amplifier output signal. Then the statistics generator 114 uses the frequency distribution to approximate probability distribution. Assume the random variable z represents the amplitude of random signal, and $f_z(z)$ represents signal amplitude probability distribution which the receiving end analyzes, the orthogonality of random function defined for the random variable z can be expressed as:

$$\langle \phi_k(z), \phi_l(z) \rangle = E_z[\phi_k(z)\phi_l(z)] = \int_z \phi_k(z)\phi_l(z)f_z(z)dz = 0 \quad (1)$$

Wherein $$\phi_l(z) = \sum_{l=1}^{k} a_l z^l$$

represents me orthogonal polynomial, and k represents the order of the polynomial. For amplitude probability distribution of different power amplifier output signals, orthogonal polynomial basis functions will be different.

For example, if z~U[0,1], which means the variable z is uniformly distributed, and the polynomial basis function set can be represented as $\psi_k(z)=z^k$, therefore the corresponding orthogonal polynomial basis functions are as follows:

$\phi_1(z)=z$ $\phi_2(z)=5.14z^2-3.87z$ $\phi_3(z)=22.69z^3-30.41z^2+9.17z$ $\phi_4(z)=95.62z^4-180.16z^3+103.45z^2-17.33z$ $\phi_5(z)=394.69z^5-951.81z^4+796.98z^3-266.93z^2+28.74z$ (2)

. . .

Alternatively, the orthogonal basis function generator 116 uses Gram-Schmidt algorithm and $f_z(z)$, to deduce the basis functions for orthogonal polynomials in an ascending order to ensure that any two basis functions are orthogonal, and each basis function is normalized. By normalization, it means that the Euclidean Norm $\|x\|_2 = \langle x,x \rangle^{1/2}$ equals 1.

If the amplitudes of the signals are in Rayleigh distribution (such as OFDM signals), $$f_z(z) = \begin{cases} \dfrac{z}{\sigma^2} e^{-\dfrac{z^2}{2\sigma^2}}, & z \geq 0 \\ 0, & z < 0 \end{cases} \quad (3)$$

The first five orders of the orthogonal polynomials can be represented as $\phi_1(z)=z$ $\phi_2(z)=8.79z^2-2.75z$ $\phi_3(z)=56.15z^3-37.78z^2+5.6z$ $\phi_4(z)=299.18z^4-321.85z^3+103.61z^2-9.72z$ $\phi_5(z)=1404.41z^5-2132.95z^4+1106.14z^3-227.79z^2+15.28z$ (4)

Embodiments use probability density distribution of amplitudes of power amplifier output signals to determine orthogonal polynomial basis functions, so as to solve the instability of variable values during estimating predistortion parameter. Embodiments of the invention guarantee linearization effect of power amplification, and have simple structures with low cost, as embodiments of the invention need less storage memory and less computation complexity since the variation ranges of orthogonal functions are small.

Figure 2:
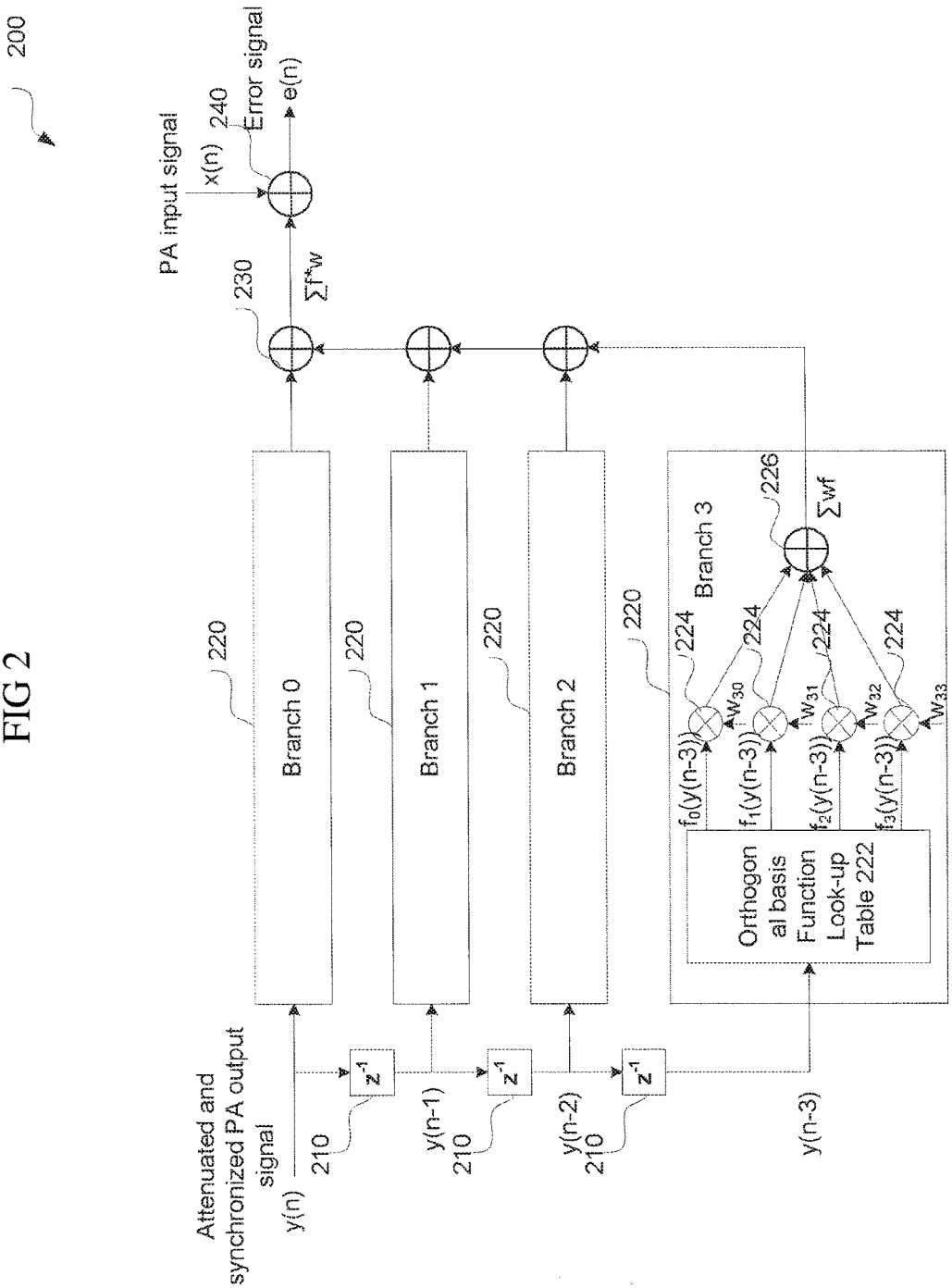
FIG. 2 is a circuit diagram for an error generator within the predistortion circuit according to an embodiment of the invention.

The predistortion coefficient training circuit 118 shown in FIG. 1 further comprises an error generator 200 as shown in FIG. 2. FIG. 2 is a circuit diagram for an error generator 200 within the predistortion circuit 100 according to an embodiment of the invention.

The error generator 200 comprises a plurality of tapped delay lines 210 connected in serial, and connected to a corresponding one of a plurality of first branches 220. In the error generator 200, both input signal of the power amplifier x(n) and attenuated and synchronized power amplified PA output signal y(n) are used to derive the error signal.

To be specific, each of the plurality of tapped delay lines 210 denoted as $Z^{-1}$ is connected to a corresponding one of a plurality of first branches 220. $Z^{-1}$ represents a unit delay. For example, the signal inputted into the first branch 220 with index 0 is not delayed, which can be represented as the attenuated PA output signal y(n) at a current sampling time instance. The signal inputted into the first branch 220 with index 1 is delayed by one delay unit, which can be denoted as delayed attenuated PA output signal y(n−1) at one previous sampling time instance, in other words, the memory length is 1. The signal inputted into the first branch 220 with index 2 is delayed by two delay units, which can be denoted as delayed attenuated PA output signal y(n−2) at two previous sampling time instance, in other words, the memory length is 2. The amount of the plurality of tapped delay lines 210 equal the memory depth. For example, for an equation with a memory depth of Q, it means that the current output sample is related to the current input, as well as previous (Q-1) input samples. Further each of the branches comprises basis functions given by equation (4). For example, if the orthogonal basis functions of equation (4) are used, as there are 5 orthogonal basis functions, each of the first branches 220 (for example, branch 0, branch 1, branch 2, and branch 3 shown in FIG. 2) includes the five orthogonal basis functions.

For the plurality of first branches 220, each of the plurality of first branches 220 further comprises an orthogonal basis function look-up table 222, a plurality of first multipliers 224, and a first summator 226.

The orthogonal basis function look-up table 222 generates a plurality of orthogonal basis functions $f_0(y(n-3))$, $f_1(y(n-3))$, $f_2(y(n-3))$, $f_3(y(n-3))$ via a plurality of output ports. The plurality of first multipliers 224 each is connected to a corresponding output port of the plurality of output ports, and generates a weighed orthogonal basis function by multiplying a corresponding orthogonal basis function $f_0(y(n-3))$, $f_1(y(n-3))$, $f_2(y(n-3))$, $f_3(y(n-3))$ with a corresponding weighing coefficients $w_{30}$, $w_{31}$, $w_{32}$, $w_{33}$. The first summator 226 is connected to the plurality of first multipliers 224 and generates a summed signal $\Sigma wf$ by summing the weighed orthogonal basis function in a single branch. In FIG. 2, only four orthogonal basis functions are shown in a branch. Those ordinary skill in the art can understand, however, the amount of the orthogonal basis function can vary according to different application scenarios. Note the amount of the orthogonal basis function are determined by non-linear character of the power amplifier, and takes into consideration of the cost and performance, therefore some high-order orthogonal functions can be ignored.

In the orthogonal basis function look-up table, a normalizing operation is used to construct the orthogonal basis function sets with each basis function' Euclidean norm equal to 1. Further, the normalization factor is computed based on PDF of the input signal.

The error generator 200 further comprises a second summator 230, and a third summator 240. The second summator 230 is connected to the plurality of first branches 220 and generates a summed weighed signal $\Sigma f^*w$ by summing the summed signal from the plurality of first branches 220 (for example, branch 0, branch 1, branch 2 and branch 3 shown in FIG. 2). The third summator 240 is connected to the second summator 230, and generates an error signal $e(n)$ by adding the amplified signal $x(n)$ outputted by the power amplifier to the summed weighed signal $\Sigma f^*w$.

Figure 3:
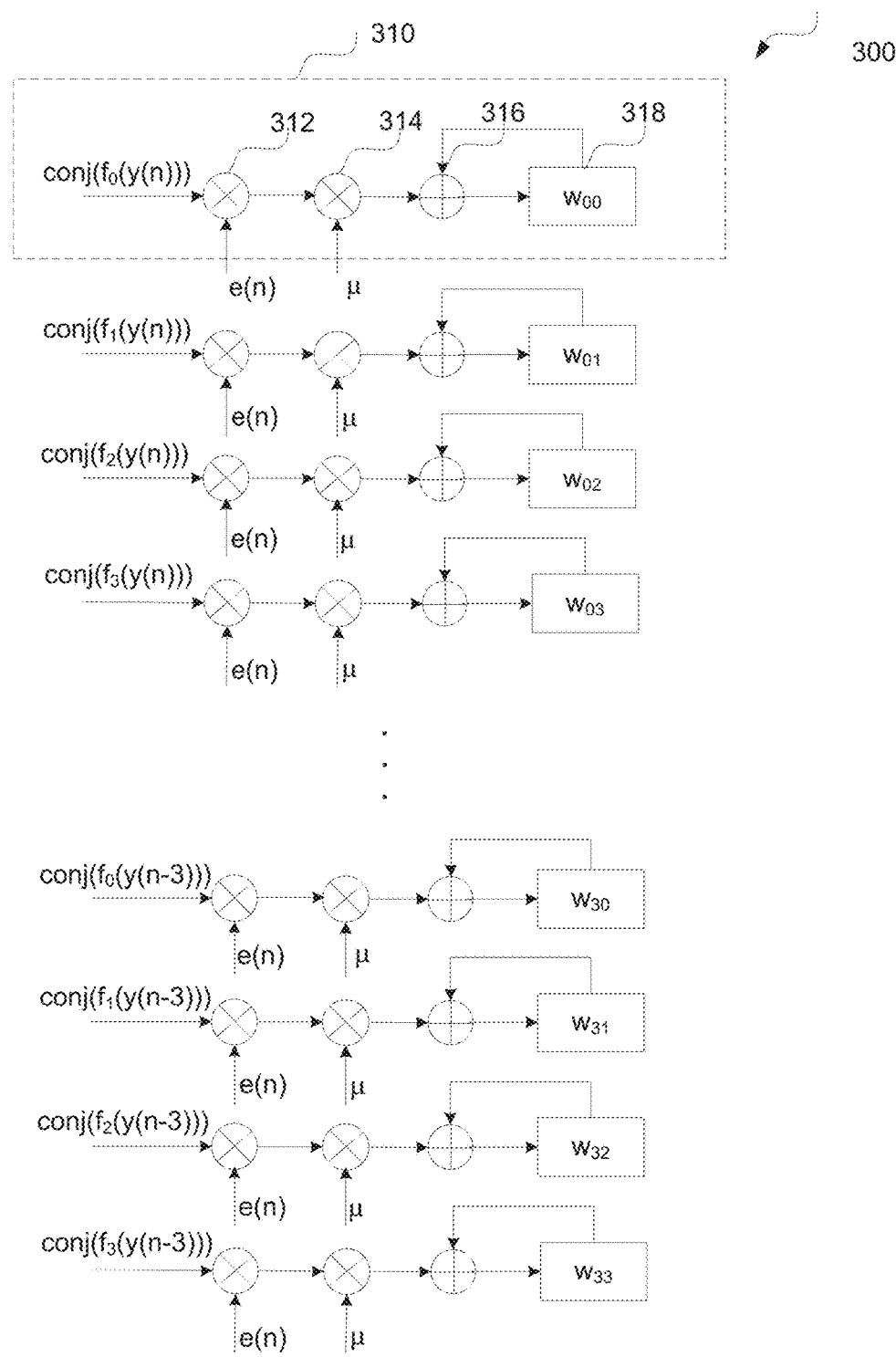
FIG. 3 is a circuit diagram for a coefficient updating unit within the predistortion circuit according to an embodiment of the invention.

The predistortion coefficient training circuit 118 shown in FIG. 1 further comprises an coefficient updating unit 300. FIG. 3 is a circuit diagram for the coefficient updating unit 300 within the predistortion circuit according to an embodiment of the invention.

The coefficient updating unit 300 within the predistortion coefficient training circuit 118 further comprises a plurality of second branches 310. Each second branch 310 comprises a second multiplier 312, a third multiplier 314, and a fourth summator 316. The second multiplier 312 generates a modification value for the current tap coefficient $\text{conj}(f_0(y(n)))*e(n)$ by multiplying a conjugate of the corresponding orthogonal basis function with the error signal $e(n)$. The third multiplier 314 is connected to the second multiplier 312, and generates an adapted modification value for the current tap coefficient $\text{conj}(f_0(y(n)))*e(n)*\mu$ by multiplying the weighed orthogonal basis function with an adaption constant $\mu$. Wherein, constant $\mu$ represents step size in an iterative solution, namely, the extent that the error generated during each estimation modifies the coefficient. The fourth summator 316 is connected to the third multiplier 314 and an output unit 318. The fourth summator 316 generates the updated predistortion coefficient $w_{00}$, $w_{01}$, $w_{02}$ by adding the adapted orthogonal basis function to an existing corresponding weighing coefficient. $w_{00}$ represents the weighing coefficient for the first order orthogonal function corresponding to the current sample, and $w_{01}$ represents the weighing coefficient for the second order orthogonal function corresponding to the current sample, and so on.

Alternatively, the orthogonal basis function generator further generates a set of normalized orthogonal basis functions by using Gram-Schmidt algorithm.

Alternatively, the orthogonal basis function generator further generates a set of orthogonal basis functions from the lowest order to the highest order by using Gram-Schmidt algorithm.

Alternatively, the predistortion coefficient training circuit 118 is further generates the updated predistortion coefficient using least square or least mean square (LMS) method.

Alternatively, the orthogonal basis function generator is an offline generator.

Alternatively, the orthogonal basis function generator is an online generator.

Figure 4:
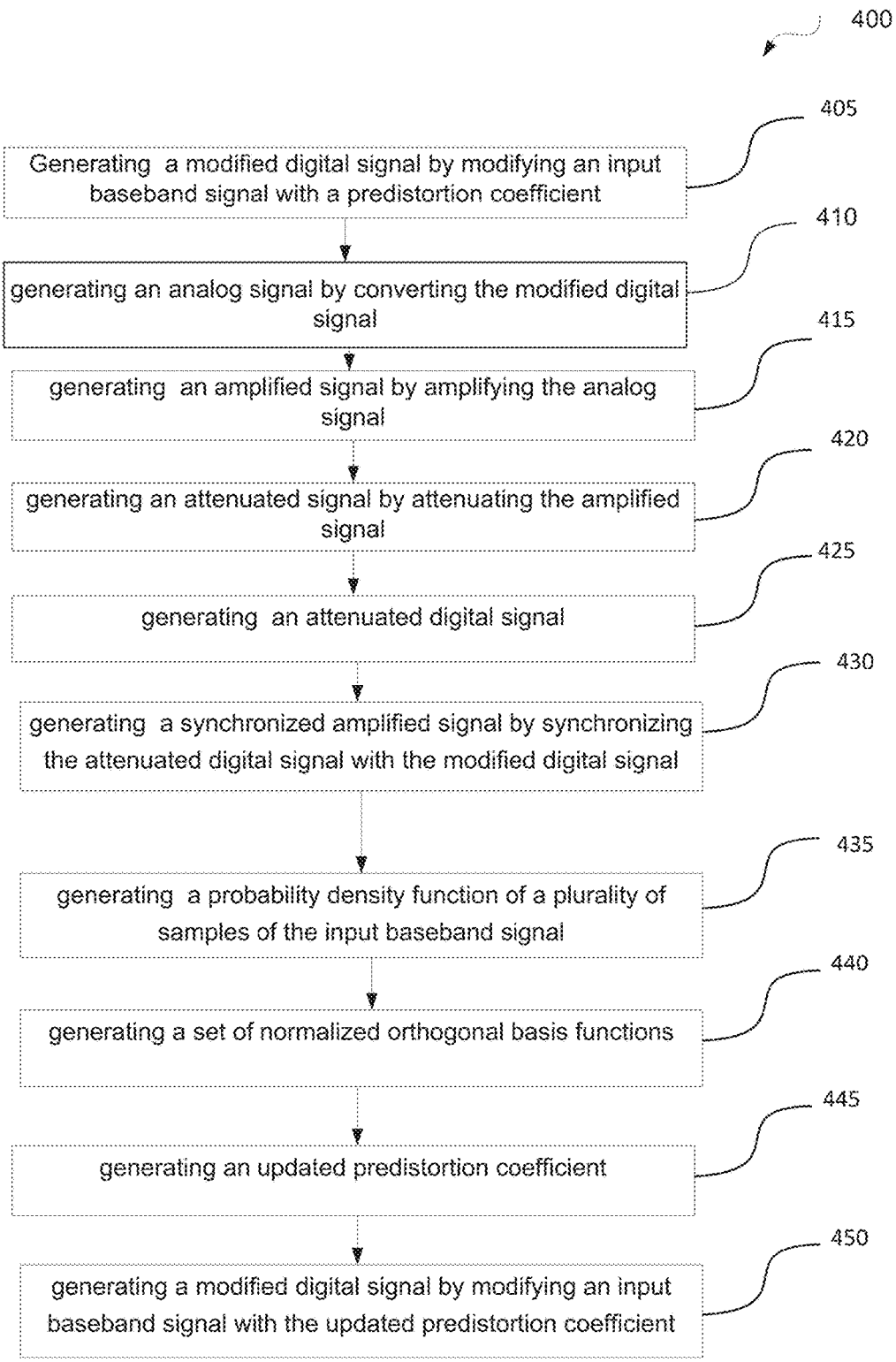
FIG. 4 is a flow chart illustrating a method for predistortion according to an embodiment of the invention.

FIG. 4 is a flow chart illustrating a method 400 for predistortion according to an embodiment of the invention.

The method 400 for predistortion comprises generating in block 405, by a digital predistorter, a modified digital signal by modifying an input baseband signal with a predistortion coefficient; generating in block 410, by a digital to analog converter connected to the digital predistorter, an analog signal by converting the modified digital signal; generating in block 415, by a power amplifier connected to the digital to analog converter, an amplified signal by amplifying the analog signal; generating in block 420, by an attenuator connected to the power amplifier, an attenuated signal by attenuating the amplified signal; generating in block 425, by an analog to digital converter connected to the attenuator, an attenuated digital signal; generating in block 430, by a timing synchronizer connected to both the digital predistorter and the analog to digital converter, a synchronized amplified signal by synchronizing the attenuated digital signal with the modified digital signal; generating in block 435, by a statistics generator connected to the analog to digital converter, a probability density function of a plurality of samples of the input baseband signal; generating in block 440, by an orthogonal basis function generator connected to the statistics generator, a set of normalized orthogonal basis functions; generating in block 445, by a predistortion coefficient training circuit connected to the orthogonal basis function generator and the synchronizer, an updated predistortion coefficient; and generating in block 450, by the digital predistorter further connected to the predistortion coefficient training circuit, a modified digital signal by modifying an input baseband signal with the updated predistortion coefficient.

Alternatively, the predistortion coefficient training circuit further comprises an error generator, and the error generator comprises a plurality of first branches, for each of the plurality of first branches, the method 400 comprises (not shown in FIG. 4) delaying, by a plurality of tapped delay lines connected in serials, a corresponding one of the plurality of first branches, and generating, by an orthogonal basis function look-up table, a plurality of orthogonal basis functions; multiplying, by each of a plurality of first multipliers, a corresponding orthogonal basis function with a corresponding weighing coefficients; generating, by a first summator connected to the plurality of first multipliers, a summed signal by summing the weighed orthogonal basis function; generating, by a second summator connected to the plurality of first branches, a summed weighed signal by summing the summed signal from the plurality of first branches; generating, by a third summator connected to the second summator, an error signal by adding the amplified signal outputted by the power amplifier to the summed weighed signal.

Alternatively, the predistortion coefficient training circuit further comprises a coefficient updating unit, wherein the coefficient updating unit further comprises a plurality of second branches, in each second branch, the method 400 further comprises (not shown in FIG. 4) generating, by a second multiplier, a weighed orthogonal basis function by multiplying a conjugate of the corresponding orthogonal basis function with the error signal; generating, by a third multiplier connected to the second multiplier, an adapted orthogonal basis function by multiplying the weighed orthogonal basis function with an adaption constant μ; and generating, by a fourth summator connected to the third multiplier and an output unit, the updated predistortion coefficient by adding the adapted orthogonal basis function to an existing corresponding weighing coefficient.

Alternatively, generating by the orthogonal basis function generator connected to the statistics generator, the set of normalized orthogonal basis functions is implemented by using Gram-Schmidt algorithm.

Alternatively, generating by the orthogonal basis function generator, a set of orthogonal basis functions, is implemented from the lowest order to the highest order by using Gram-Schmidt algorithm.

Alternatively, generating, by the predistortion coefficient training circuit, the updated predistortion coefficient is implemented based on the equation $$z(n) = \sum_{k=1}^{K} \sum_{q=0}^{Q} w_{kq} \phi_k(x(n-q)),$$

wherein K represents a non-linear order, Q represents a memory depth, $w_{kq}$ represents the updated predistortion coefficient, $\phi_k(x)$ represents a plurality of non-linear transformation of the input baseband signal, wherein any two of different $\phi_k(x)$ are orthogonal.

Alternatively, generating by the predistortion coefficient training circuit, the updated predistortion coefficient is implemented by using least square or least mean square method.

Alternatively, the orthogonal basis function generator is an offline generator.

Alternatively, the orthogonal basis function generator is an online generator.

Figure 5A:
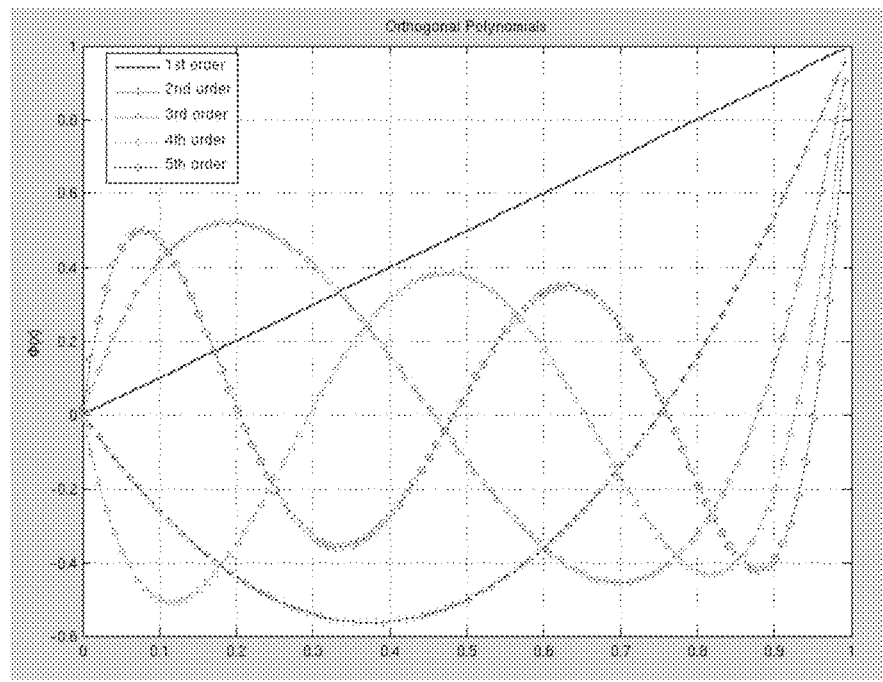
FIG. 5A shows a simulation diagram for the amplitude relationship between input signal and output signal according to a conventional device.

FIG. 5A shows a simulation diagram for the amplitudes between input signal and output signal according to a prior art reference. In FIG. 5A, the data are obtained from FIG. 4 of prior art Chinese application with filing number of CN201110392628. 7. The X axis represents input x, and Y axis represents output phase Φ(X).

Figure 5B:
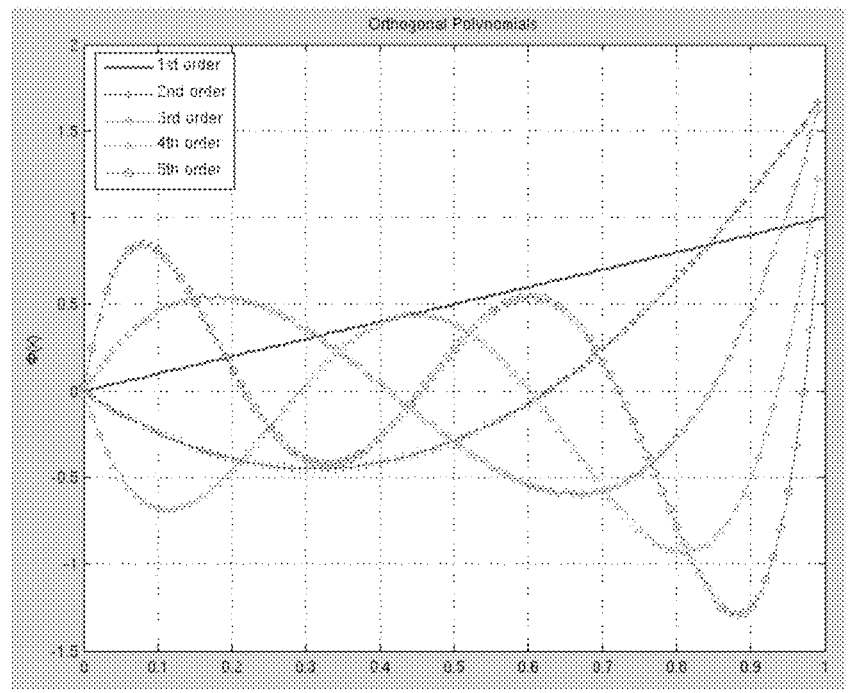
FIG. 5B shows a simulation diagram for the amplitude relationship between input signal and output signal according to an embodiment of the invention.

FIG. 5B shows a simulation diagram for the amplitudes between input signal and output signal according to an embodiment of the invention. The X axis represents input x, and Y axis represents output phase Φ(X). By calculation, it can be obtained that the orthogonal functions given in FIG. 5B has a lower correlation than orthogonal functions given in FIG. 5A.

Figure 6:
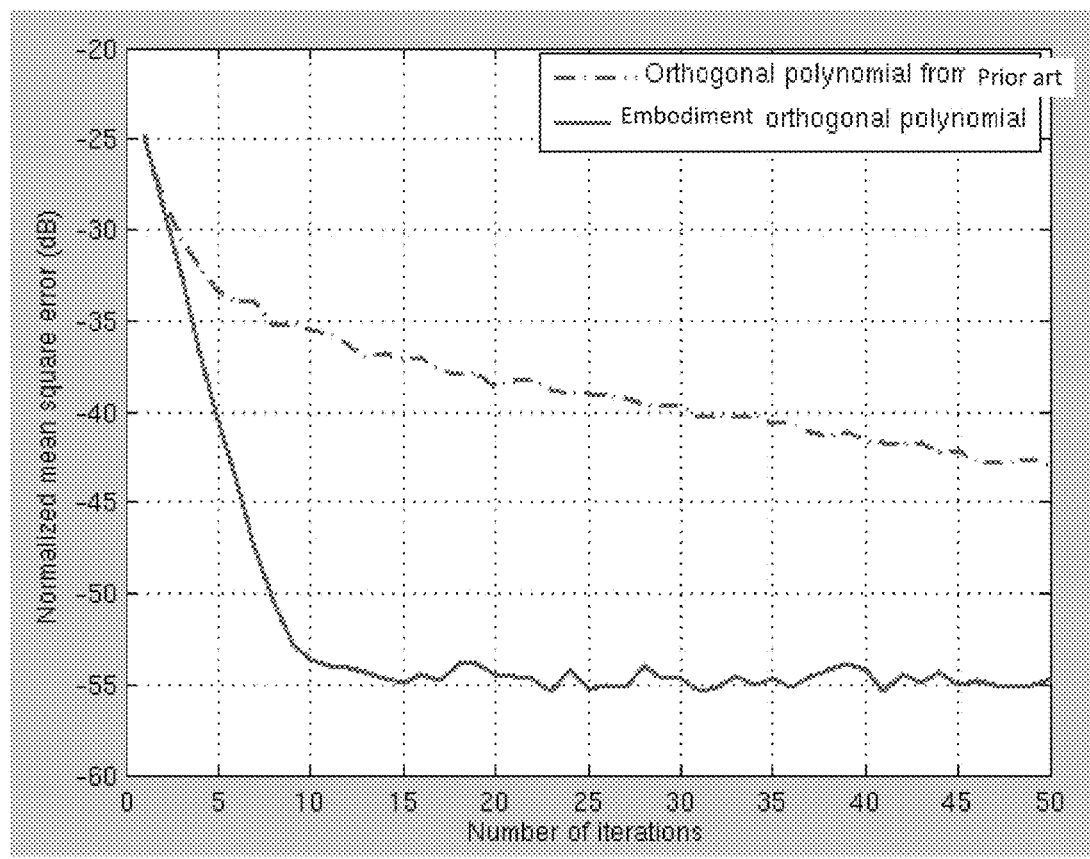
FIG. 6 is simulation diagram illustrating normalization error of predistortion using two different orthogonal polynomial basis functions according to an embodiment of the invention.

FIG. 6 is simulation diagram illustrating normalization error of predistortion using two different orthogonal polynomial basis functions according to an embodiment of the invention. The X axis represents number of iterations, and the Y axis represents normalized mean square error, in unit of dB. It can be seen from FIG. 6 that compared with the conventional predistortion device, an embodiment of the invention can be converged to a stable lower error more quickly.

Figure 7:
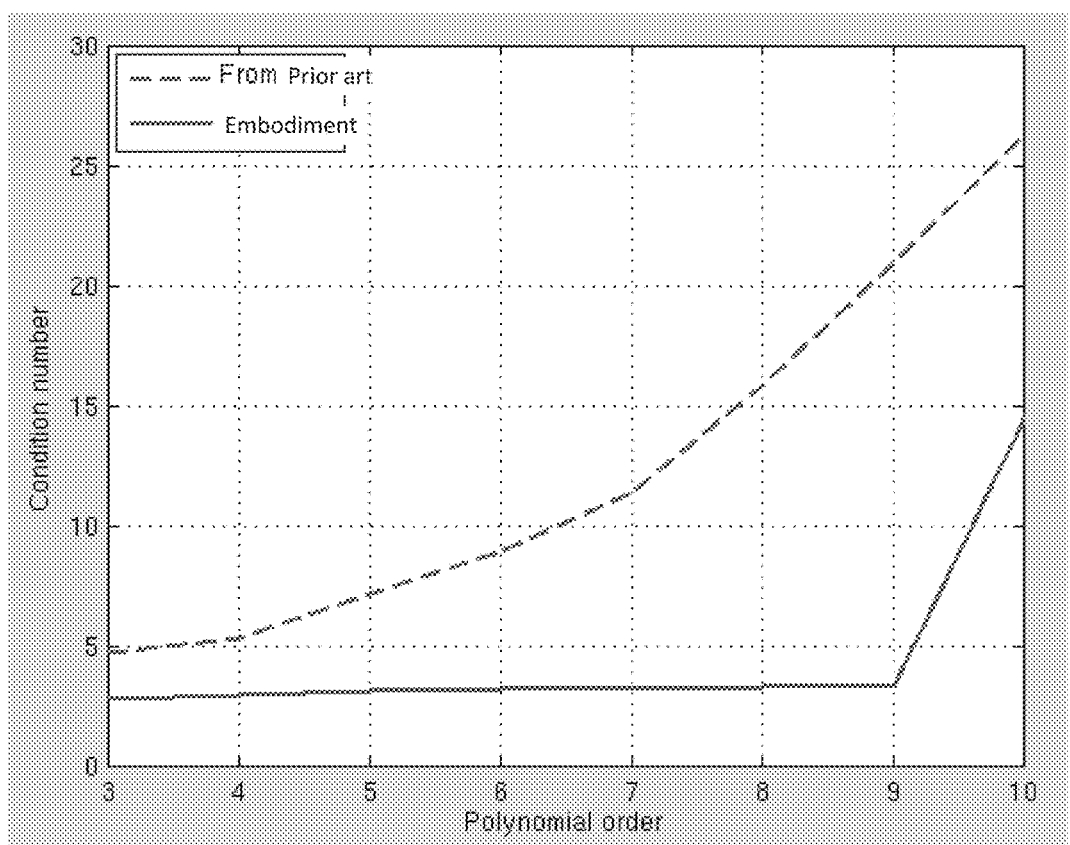
FIG. 7 is a diagram illustrating the relationship between rank of the matrix comprising the orthogonal polynomial and the orders of the orthogonal polynomial according to an embodiment of the invention.

FIG. 7 is a diagram illustrating the relationship between rank of the matrix comprising the orthogonal polynomial and the orders of the orthogonal polynomial according to an embodiment of the invention. The solid line represents the embodiments of the invention, while the dotted line represents the convention method. FIG. 7 means that, with the use of orthogonal functions of embodiments of the present invention, a process for solving the predistortion coefficient converges faster, with more stable values. By contrast, with the conventional method shown in FIG. 7, with the increase in the order of orthogonal functions, the stability decreased rapidly in solving the comparison predistortion coefficients by using the convention method. With an increase in polynomial order, it will be harder to maintain orthogonal among the high-order polynomial with the each previous polynomials, thus resulting in higher correlation, and larger condition number.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

We claim:

1. A circuit for predistortion, comprising
a digital predistorter, configured to generate a modified digital signal by modifying an input baseband signal with a predistortion coefficient;
a digital to analog converter (DAC) connected to the digital predistorter and configured to generate an analog signal by converting the modified digital signal;
a power amplifier (PA) connected to the digital to analog converter and configured to generate an amplified signal by amplifying the analog signal;
an attenuator connected to the power amplifier and configured to generate an attenuated signal by attenuating the amplified signal;
an analog to digital converter (ADC) connected to the attenuator, configured to generate an attenuated digital signal;
a timing synchronizer connected to both the digital predistorter and the analog to digital converter and configured to generate a synchronized signal by synchronizing the attenuated digital signal with the modified digital signal;
a statistics generator connected to the analog to digital converter and configured to generate a probability density function of a plurality of samples of the input baseband signal;
an orthogonal basis function generator connected to the statistics generator and configured to generate a set of normalized orthogonal basis functions;
a predistortion coefficient training circuit connected to the orthogonal basis function generator and the timing synchronizer and configured to generate an updated predistortion coefficient;

wherein the predistortion coefficient training circuit is further connected to the digital predistorter, and the digital predistorter is configured to generate a modified digital signal by modifying an input baseband signal with the updated predistortion coefficient.

2. The circuit of claim 1, wherein the predistortion coefficient training circuit further comprises an error generator, wherein the error generator comprises a plurality of tapped delay lines connected in serials, wherein each of the plurality of tapped delay lines is connected to a corresponding one of a plurality of first branches, and the plurality of first branches, wherein each of the plurality of first branches comprises an orthogonal basis function look-up table configured to generate a plurality of orthogonal basis functions via a plurality of output ports;

a plurality of first multipliers each connected to a corresponding output port of the plurality of output ports, and configured to generate a weighed orthogonal basis function by multiplying a corresponding orthogonal basis function with a corresponding weighing coefficients;

a first summator connected to the plurality of first multipliers and configured to generate a summed signal by summing the weighed orthogonal basis function;

a second summator connected to the plurality of first branches and configured to generate a summed weighed signal by summing the summed signal from the plurality of first branches;

a third summator connected to the second summator and configured to generate an error signal by adding the amplified signal outputted by the power amplifier to the summed weighed signal.

3. The circuit of claim 2, wherein the predistortion coefficient training circuit further comprises a coefficient updating unit, wherein the coefficient updating unit further comprises a plurality of second branches, and each second branch comprises a second multiplier configured to generate a weighed orthogonal basis function by multiplying a conjugate of the corresponding orthogonal basis function with the error signal;

a third multiplier connected to the second multiplier, and configured to generate an adapted orthogonal basis function by multiplying the weighed orthogonal basis function with an adaption constant; and a fourth summator connected to the third multiplier and an output unit, and configured to generate the updated predistortion coefficient by adding the adapted orthogonal basis function to an existing corresponding weighing coefficient.

4. The circuit of claim 1, wherein the orthogonal basis function generator is an offline generator.

5. The circuit of claim 1, wherein the orthogonal basis function generator is an online generator.

6. A method for predistortion, comprising generating, by a digital predistorter, a modified digital signal by modifying an input baseband signal with a predistortion coefficient;

generating, by a digital to analog converter connected to the digital predistorter, an analog signal by converting the modified digital signal;

generating, by a power amplifier connected to the digital to analog converter, an amplified signal by amplifying the analog signal;

generating, by an attenuator connected to the power amplifier, an attenuated signal by attenuating the amplified signal;

generating, by an analog to digital converter connected to the attenuator, an attenuated digital signal;

generating, by a timing synchronizer connected to both the digital predistorter and the analog to digital converter, a synchronized signal by synchronizing the attenuated digital signal with the modified digital signal;

generating, by a statistics generator connected to the analog to digital converter, a probability density function of a plurality of samples of the input baseband signal;

generating, by an orthogonal basis function generator connected to the statistics generator, a set of normalized orthogonal basis functions;

generating, by a predistortion coefficient training circuit connected to the orthogonal basis function generator and the timing synchronizer, an updated predistortion coefficient;

generating, by the digital predistorter further connected to the predistortion coefficient training circuit, a modified digital signal by modifying an input baseband signal with the updated predistortion coefficient.

7. The method of claim 6, wherein the predistortion coefficient training circuit further comprises an error generator, and the error generator comprises a plurality of first branches, for each of the plurality of first branches, the method comprises delaying, by a plurality of tapped delay lines connected in serials, a corresponding one of the plurality of first branches, and generating, by an orthogonal basis function look-up table, a plurality of orthogonal basis functions;

multiplying, by each of a plurality of first multipliers, a corresponding orthogonal basis function with a corresponding weighing coefficients to generate a weighed orthogonal basis function;

generating, by a first summator connected to the plurality of first multipliers, a summed signal by summing the weighed orthogonal basis function;

generating, by a second summator connected to the plurality of first branches, a summed weighed signal by summing the summed signal from the plurality of first branches;

generating, by a third summator connected to the second summator, an error signal by adding the amplified signal outputted by the power amplifier to the summed weighed signal.

8. The method of claim 7, wherein the predistortion coefficient training circuit further comprises a coefficient updating unit, wherein the coefficient updating unit further comprises a plurality of second branches, in each second branch, the method further comprises generating, by a second multiplier, a weighed orthogonal basis function by multiplying a conjugate of the corresponding orthogonal basis function with the error signal;

generating, by a third multiplier connected to the second multiplier, an adapted orthogonal basis function by multiplying the weighed orthogonal basis function with an adaption constant; and generating, by a fourth summator connected to the third multiplier and an output unit, the updated predistortion coefficient by adding the adapted orthogonal basis function to an existing corresponding weighing coefficient.

9. The method of claim 6, wherein the orthogonal basis function generator is an offline generator.

10. The method of claim 6, wherein the orthogonal basis function generator is an online generator.

* * * * *